United States Patent [19]

Uno et al.

[11] 4,387,355
[45] Jun. 7, 1983

[54] SURFACE ACOUSTIC WAVE RESONATOR

[75] Inventors: Takehiko Uno; Hiromichi Jumonji, both of Yokosuka, Japan

[73] Assignee: Nippon Telegraph & Telephone Public Corporation, Tokyo, Japan

[21] Appl. No.: 267,680

[22] Filed: May 28, 1981

[30] Foreign Application Priority Data

Jun. 13, 1980 [JP] Japan .................................. 55-78941
Dec. 13, 1980 [JP] Japan ................................ 55-175242

[51] Int. Cl.$^3$ .......................... H03H 9/25; H03H 9/64
[52] U.S. Cl. ..................................... 333/195; 333/196
[58] Field of Search .............................. 333/150-155, 333/193-196; 310/313 R, 313 A, 313 B, 313 C, 313 D; 331/107 A

[56] References Cited

U.S. PATENT DOCUMENTS 4,178,571 12/1979 Mitchell .............................. 333/194
4,237,433 12/1980 Tanski .............................. 333/196 X

OTHER PUBLICATIONS

Uno et al., "Realization of Miniature Saw Resonators Having a High Quality Factor," Japanese Journal of Applied Physics, vol. 20, Supplement 20-3, Sep. 1, 1981; pp. 85-88.

Primary Examiner—Marvin L. Nussbaum
Attorney, Agent, or Firm—Burgess, Ryan and Wayne

[57] ABSTRACT

A surface acoustic wave (SAW) resonator in which a pair of surface acoustic wave reflectors are spaced apart on a piezoelectric substrate from each other by a suitable distance and each consists of a grating electrode construction and a periodic array of grooves and a surface acoustic wave transducer which consists of an interdigital electrode structure and a periodic array of grooves is interposed between the reflectors and spaced apart therefrom by a suitable distance. The electrode period $L_T$ of the transducer and the electrode period $L_R$ of the reflectors are so selected as to satisfy the following equation:

$$\frac{1 - C_{2T} - C_{1T} - C_{1T}/(0.35 q_T^2 + 0.3 q_T + 0.2)}{1 - C_{2R}} \leq$$

$$L_T/L_R \leq \frac{1 - C_{2T} - C_{1T}}{1 - C_{2R}}$$

where $C_{1T}$: the acoustic mismatching term at the boundary between the electroded portion and the non-electroded portion of the transducer and is given by $$C_{1T} = |1 - Z_2/Z_1|/\pi$$

where $Z_2$: the acoustic impedance of the electroded portion, and $Z_1$: the acoustic impedance of the non-electroded portion;

$C_{2T}$: the relative frequency decrease due to the periodic structure of the transducer;

$C_{2R}$: the relative frequency decrease due to the periodic structure of the reflector; and

$q_T = \pi C_{1T} N$ where N is the number of electrode finger pairs in the transducer.

8 Claims, 17 Drawing Figures

M=210
N=80
LT/LR=0.987
$\alpha\lambda = 2 \times 10^{-4}$
hm/λ=0.008
(hg/λ)$_{IDT}$=0.022
(hg/λ)$_{REFL}$=0.013

CONDITIONS:
INVENTION: $h_{mR}=0.023\lambda$, $h_{mT}=0.01\lambda$
PRIOR ART: $h_{mR}=h_{mT}=0.023\lambda$

CONDITIONS:
$h_{mR} = h_{mT} = 0.008\lambda, h_{gR} = h_{gT} = 0.017\lambda$
$N_1 = N_2 = 80$ PAIRS, $M = 210$
$\ell_3 = 4.0\lambda$
INVENTION : $\ell_1 = \ell_2 = 1.0\lambda$
PRIOR ART: $\ell_1 = \ell_2 = 7/\gamma\lambda$

SURFACE ACOUSTIC WAVE RESONATOR

BACKGROUND OF THE INVENTION

The present invention relates to a surface acoustic wave resonator which is compact in size and has a high Q and a low resonance resistance.

In general, surface acoustic wave resonators (to be referred to as "SAW resonators" in this specification) comprises a piezoelectric substrate, a pair of surface acoustic wave grating reflectors formed on the substrate and an interdigital transducer formed on the substrate between the reflectors. Surface acoustic waves propagate between the reflector pair and resonate at a certain frequency, and this resonance is coupled to an electric circuit via terminals. Such SAW resonators as described above have been known as "the cavity type". It has been well known that in the prior art cavity type SAW resonators, their Q and resonance resistance $R_1$ are dependent upon a maximum absolute value $|\Gamma|_{max}$ of the reflection coefficient $\Gamma$ of a reflector and the radiation conductance $G_a$ of a transducer and have the following relations:

$$Q \propto 1/(1-|\Gamma|_{max}^2) \quad (1)$$

and $$R_1 = \frac{1-|\Gamma|_{max}}{2|\Gamma|_{max} G_a} \quad (2)$$

It follows, therefore, that in order to obtain a SAW resonator with a high Q and a low $R_1$, the reflection coefficient $|\Gamma|_{max}$ be as close to unity as possible and the radiation conductance $G_a$ be increased as high as possible. As a result, both the reflectors and transducer need an extremely large number of electrodes. When a substrate consists of a quartz crystal having a lesser degree of surface acoustic wave reflecting capability through its piezoelectricity, a number of 500 to 1,000 reflector electrodes are arranged in general so that it has been difficult to make the SAW resonators compact in size.

In order to eliminate this drawback, there has been proposed a method for improving the reflection coefficient by forming periodic arrays of grooves on the surface of the substrate.

The prior art cavity type SAW resonators are so designed that the resonance is obtained at a frequency $f_R$ (to be referred to as "the center frequency of the reflector" in this specification) at which the reflection coefficient $|\Gamma|$ of the reflector becomes maximum. The resonance is also affected by the spacing between the transducer and the reflector, thus the spacing being one of the most important design criteria. It has been also well known in the art that an optimum spacing is obtained from the following equation:

$$l_1 + l_2 = (n/2 + \frac{1}{4})\lambda \quad (3)$$

where $l_1$ is the spacing between the transducer and one of the two reflectors;

$l_2$ is the spacing between the transducer and the other reflector;

n: a positive integer; and $\lambda$: the wavelength of surface acoustic waves at the resonance frequency.

That is, in the design of the prior art SAW resonators the spacings between the transducer and the reflectors are obtained from Eq. (3) so that the resonance is obtained at the center frequency $f_R$ of the reflector.

So far in the design of the SAW resonators, the characteristics of the reflectors have attracted much more attention than those of the transducer and have been investigated in detail. However, there has not been disclosed any technical report and appear particularly concerning the characteristics of the transducer. Therefore, the inventors made extensive studies and experiments of the frequency dependency of the reflection coefficient of the reflectors and the acoustic radiation conductance of the transducer in the prior art SAW resonator in which the transducer electrode period is equal to the reflector electrode period. The results showed that the reflector center frequency $f_R$ is spaced apart from a frequency $f_T$ (to be referred to as "the center frequency of the transducer") at which the acoustic radiation conductance becomes maximum. That is, $f_T < f_R$. Furthermore, it was found out that the acoustic radiation conductance $G_a$ decreases considerably as compared with its maximum value at frequencies in the vicinity of the center frequency $f_R$ of the reflector.

These observed facts show that in the prior art SAW resonators, the frequency response of the transducer is not fully utilized. As a consequence and as it is readily seen from Eq. (2), in order to lower the resonance resistance $R_1$, the decrease in the radiation conductance $G_a$ at the resonance frequency must be compensated for by an increase in the reflection coefficient. As a result, the reflectors must consist of a large number of electrodes.

Meanwhile it has been proposed to provide the reflector with a periodic array of grooves so that the reflection coefficient may be increased. However, the frequency dependency of the acoustic conductance of the transducer is still not fully utilized so that the number of reflector electrodes cannot be reduced to a desired degree. As a result, the prior art SAW resonators cannot be made compact in size.

SUMMARY OF THE INVENTION

In view of the above, one of the objects of the present invention is to provide a SAW resonator in which the frequency dependency of the acoustic radiation conductance of a transducer are fully utilized so that the resonance resistance is lowered, the Q value is increased, the capacitance ratio is small and that the SAW resonator can be made compact in size and mounted in a simple manner.

Another object of the present invention is to provide a SAW resonator in which the ratio between the electrode period of the transducer and the electrode period of the reflectors is optimized so that the center frequency $f_R$ of the reflectors can be made coincident with the center frequency $f_T$ of the transducer.

A further object of the present invention is to provide a SAW resonator in which the center frequency $f_R$ of the reflectors is made equal to the center frequency $f_T$ of the transducer and the spacings between the transducer and the reflectors are so selected that the resonance conditions are satisfied at the center frequency $f_R(=f_T)$.

A yet another object of the present invention is to provide a SAW resonator in which a piezoelectric substrate is mounted only at two points so that the stresses caused by the mounting are minimized and consequently resistance to vibrations and impacts as well as the frequency aging characteristic can be improved.

Briefly stated, according to the present invention, a pair of surface acoustic wave reflectors each consisting of a periodic array of electrodes and a periodic array of grooves are formed over one surface of a piezoelectric substrate and spaced apart from each other by a suitable distance and a surface acoustic wave transducer consisting of an interdigital electrode structure and a periodic array of grooves is interposed between the reflectors. In this arrangement, the present invention is featured in that the electrode period $L_T$ of the transducer and the electrode period $L_R$ of the reflectors are so selected as to satisfy the following equation:

$$\frac{1 - C_{2T} - C_{1T} - C_{1T}/(0.35q_T^2 + 0.3q_T + 0.2)}{1 - C_{2R}} \leq$$

$$L_T/L_R \leq \frac{1 - C_{2T} - C_{1T}}{1 - C_{2R}}$$

where $C_{1T}$: the acoustic mismatching term at the boundary between the electroded portion and the non-electroded portion of the transducer and is given by $$C_{1T} = |1 - Z_2/Z_1|/\pi$$

where $Z_2$: the acoustic impedance of the electroded portion, and $Z_1$: the acoustic impedance of the non-electroded portion;

$C_{2T}$: the frequency decrease due to the periodic structure of the transducer;

$C_{2R}$: the frequency decrease due to the periodic structure of the reflector; and $q_T = \pi C_{1T} N$ where N is the number of electrode finger pairs in the transducer.

The above and other objects, effects and features of the present invention will become more apparent from the following description of preferred embodiments thereof taken in conjunction with the accompanying drawings.

DETAILED DESCRIPTION OF THE INVENTION

Figure 1:
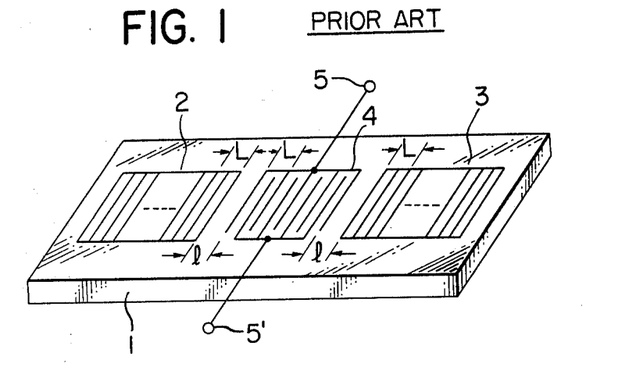
FIG. 1 is a perspective view of a cavity type SAW resonator.
Figure 2:
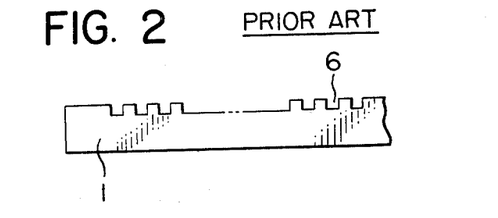
FIG. 2 is a sectional view of a groove grating reflector.

In general, as shown in FIG. 1, the SAW resonators comprises two surface acoustic wave reflectors 2 and 3 each consisting of a great number of grating reflector electrodes formed on the surface of a substrate 1 and an interdigital transducer 4 which is placed between the surface acoustic wave reflectors 2 and 3 and which consists of a great number of equally-spaced electrode finger pairs. Resonance attained by causing the surface acoustic waves to propagate between the reflectors 2 and 3 is coupled through terminals 5 and 5' to an electric circuit. In order to improve the reflection coefficient, periodic grooves 6 are formed on the surface of the substrate 1 as shown in FIG. 2.

Figure 3:
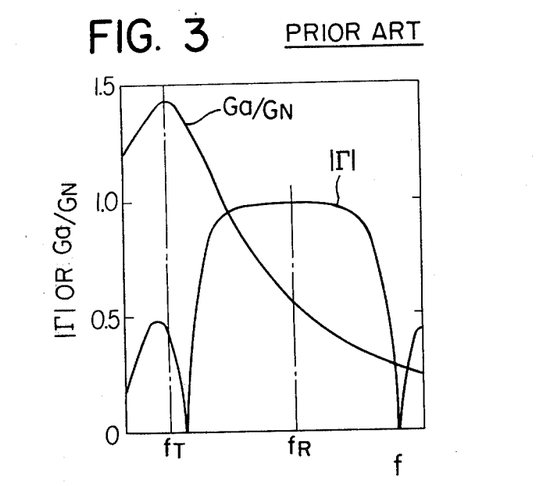
FIG. 3 shows the relationships between the frequency on the one hand and the reflection coefficient $|\Gamma|$ of the reflector of a prior art SAW resonator and the acoustic radiation conductance $G_a$ of the transducer thereof on the other hand.

FIG. 3 shows the relations between the frequency and the reflection coefficient $|\Gamma|$ and the normalized acoustic radiation conductance $G_a/G_N$ when the period of the fingers of the transducer 4 and the period of the grating reflector electrodes of the reflectors 2 and 3 are made equal to L (See FIG. 1). $G_N$ is a reference value which is determined depending upon the substrate and the number of electrode finger pairs in the transducer 4. That is, $$G_N = 1.435 \omega_o C_s N^2 K^2$$

where $\omega_o$ is the center frequency of the transducer 4, $C_s$ is an electrostatic capacitance per one electrode finger pair, N is the number of electrode finger pairs, and K is the electromechanical coupling coefficient of the substrate 1 for the surface acoustic waves.

It is apparent from FIG. 3 that the center frequency $f_R$ of the reflector is higher than the center frequency $f_T$ of the transducer; that is, $f_T < f_R$. The normalized conductance $G_a/G_N$ is smaller than unity in the vicinity of the frequency $f_R$ and is less than one half as compared with its maximum value. The resonance frequency of the SAW resonator coincides with the center frequency $f_R$ of the reflector so that it is apparent that in the prior art SAW resonators the frequency selectivity of the transducer is not fully utilized.

Figure 4A:
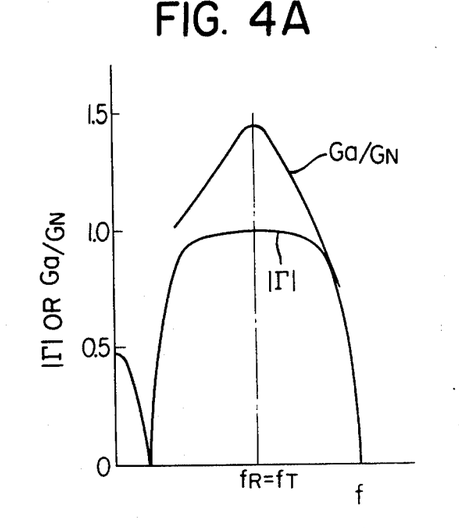
FIGS. 4A and 4B show the relationships between $|\Gamma|$ and $G_a$ of SAW resonators in accordance with the present invention.
Figure 4B:
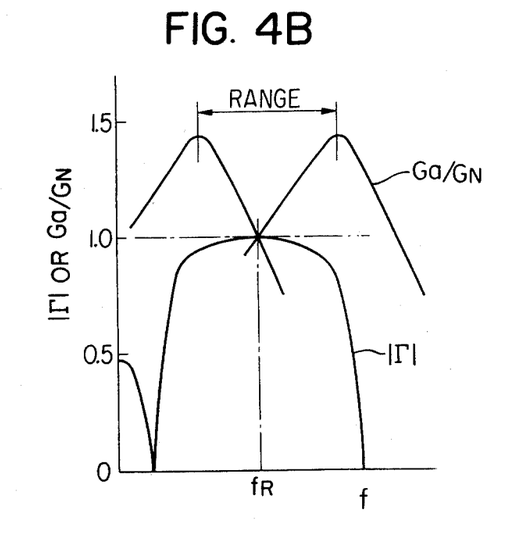

The present invention is based on the analyses of the prior art described previously. According to the present invention, as shown in FIG. 4A, the center frequency $f_R$ of the reflector coincides with the center frequency $f_T$ of the transducer. Alternatively, as shown in FIG. 4B, the period of electrode or finger pairs of a transducer is so selected that the center frequency $f_T$ of the transducer is positioned within a predetermined range in which the reflection coefficient as well as the radiation conductance can have high values in the vicinity of the center frequency $f_R$ of the reflector.

Furthermore, according to the present invention, the transducer is spaced apart from the reflectors by such a distance that the resonance conditions may be satisfied at a frequency $f=f_R(=f_T)$.

Figure 5:
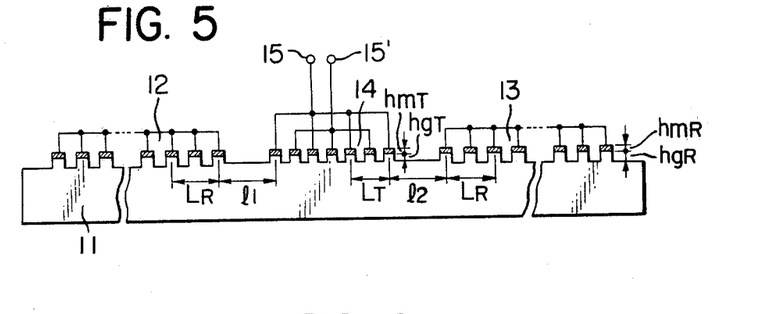
FIG. 5 is a sectional view of a first embodiment of the present invention.

In FIG. 5 is shown in cross section, a preferred embodiment of a surface acoustic wave resonator in accordance with the present invention. A substrate 11 is made of a piezoelectric crystal such as an ST-cut quartz substrate. Each of reflectors 12 and 13 consists not only of a great number of periodic electrodes of a thickness $h_{mR}$ but also of a great number of periodic grooves of a depth $h_{gR}$, the grooves being formed by a plasma etching process or the like. Thus, the reflectors 12 and 13 are of the metal-groove construction.

A transducer 14 is also of the metal-groove construction and consists of periodic electrode fingers of a thickness $h_{mT}$ and periodic grooves of a depth $h_{gT}$. In order to coincide the center frequency $f_R$ of the reflectors 12 and 13 with the center frequency $f_T$ of the transducer 14, the ratio $L_T/L_R$, where $L_T$ is the period of the electrodes of the transducer 14 and $L_R$ is the period of electrodes in the reflectors 12 and 13, is determined based upon the results of the analyses to be described below.

The center frequency $f_R$ of the reflectors 12 and 13 is slightly lower than a reference frequency which is dependent upon the reflector electrode period $L_R$ and the propagation velocity (phase velocity) $V_S$ of the surface acoustic waves along the substrate free surface and which is given by the following relation:

$$f_o = V_S/L_R \quad (4)$$

The center frequency is expressed by the following relation:

$$f_R = (1 - C_{2R})F_S/L_R \quad (5)$$

where $C_{2R}$ represents a frequency decrease caused by the perturbation effects due to the periodic metal-groove construction. The suffix R is used to denote that this value is associated with the reflectors 12 and 13. $C_{2R}$ is also expressed in the form of $$C_{2R} = C_{2ER} + C_{2MR} \quad (6)$$

where
$C_{2ER}$ is the electrical effect, and
$C_{2MR}$ is the mechanical effect.

The mechanical effect term consists of the decrease in phase velocity due to the mass loading effect of the electrodes and the energy storage effect due to the stepwise discontinuity of grooves. $C_{2MR}$ is dependent upon the materials of the substrate and electrodes, the thickness of the electrodes and the depth of the grooves.

As reported by Koyamada et al., "Analysis of SAW Resonators Using Long IDT's and Their Applications," The Transactions of the Institute of Electronics and Communication Engineers of Japan, J60-A, No. 9, pp. 085-812, 1977 No. 9 (to be referred as "Reference [I]"), the admittance of a cavity type SAW resonator is expressed by $$Y = j\omega NC_s + \quad (7)$$

$$(2jG_{Nq}/NL_T)\left\{\frac{(1+p)(1-r'_1)}{(pe^{-1}+e)-r'_1(e^{-1}+pe)} \cdot \frac{\sin\phi}{\phi} - 1\right\}$$

where
$\omega$ is the angular frequency,
N is the number of transducer electrode pairs,
$C_s$ is the electrostatic capacitance per electrode pair of the transducer,
$G_N$ is the reference value of the acoustic radiation conductance which is dependent upon the number of electrode pairs and the substrate, $$p = \{\beta_m - (\delta + kC_{2T})/C_{1T}\} \quad (8)$$

$$q = (\delta + kC_{2T} + kC_{1T})^{-1} \quad (9)$$

$$\phi = \beta_m NL/2 \quad (10)$$

$$e = \exp(-j\phi) \quad (11)$$

$$r_1' = \Gamma\exp(-2jkl) \quad (12)$$

where $$\delta = k - k_o \quad (13)$$

$$\beta_m = \sqrt{(\delta + kC_{2T})^2 - (kC_{1T})^2} \quad (14)$$

$$k_o = 2\pi/L_T \quad (15)$$

$$k = 2\pi f/V_s \quad (16)$$

$C_{1T}$ is acoustic mismatching term at the boundary between the electroded portion and the nonelectroded portion of the transducer, and is expressed by $$C_{1T} = |1 - Z_2/Z_1|/\pi$$

where
$Z_2$ is the acoustic impedance of the electroded portion and $Z_1$ is the acoustic impedance of the nonelectroded portion.

The suffix T is added to denote that $C_{1T}$ is the value associated with the transducer 14. $C_{2T}$ is the frequency decrease due to the periodic structure of the transducer.

The radiation conductance of the transducer 14 can be obtained from the admittance when the reflectors 12 and 13 are removed so that only the transducer 14 is left on the substrate 11. Substituting $\Gamma = 0$ into Eq. (12), $r_1' = 0$. Then, Eq. (7) may be rewritten to obtain the following equations:

$$Y = G_a + j(\omega NC_s + B_a) \tag{17}$$

$$G_a = G_N \left| \frac{1+P}{e + Pe^{-1}} \right|^2 \frac{\sin^2 \phi}{\phi^2} \tag{18}$$

$$B_a = \frac{G_N}{\phi} \cdot \frac{1+P}{1-P} \left\{ \left| \frac{1+P}{e + Pe^{-1}} \right| \frac{\sin 2\phi}{2\phi} - 1 \right\} \tag{19}$$

Eq. (18) gives the radiation conductance of the transducer 14. The center frequency of $G_a$ cannot be obtained in a simple manner, but can be approximated by introducing a parameter $\eta$ expressed by Eq. (20).

$$\eta = \{F - (1 - C_{1T} - C_{2T})\}/C_{1T} \tag{20}$$

where $$F = fL_T/V_s (f = \text{frequency}) \tag{21}$$

Therefore, $\beta_m$, $\phi$ and p are expressed as follows in terms of $\eta$.

$$\beta_m = k_o C_{1T} \sqrt{\eta^2 - 2\eta} \tag{22}$$

$$\phi = q_T \sqrt{\eta^2 - 2\eta} \tag{23}$$

$$p \simeq 1 - \eta \sqrt{\eta^2 - 2\eta} \tag{24}$$

Eqs. (22), (23) and (24) are substituted into Eq. (18) so as to obtain the value of $\eta_T$ at which $G_a/G_N$ becomes maximum. Then $\eta_T$ is almost uniquely determined by $q_T$ and is expressed by the following relation:

$$\eta_T \simeq -1/(0.7q_T^2 + 0.56q_T + 0.43) \tag{25}$$

From Eqs. (20), (21) and (25), the center frequency $f_T$ of the transducer at which $G_a/G_N$ becomes maximum is given by $$f_T = \{1 - C_{2T} - C_{1T} - C_{1T}/(0.7q_T^2 + 0.56q_T + 0.43)\} \cdot V_s/L_T \tag{26}$$

where $$q_T = \pi C_{1T} N \tag{27}$$

where N is the number of transducer electrode pairs. From Eqs. (5) and (26), the ratio $L_T/L_R$ must satisfy the following equation:

$$\frac{L_T}{L_R} = \frac{1 - C_{2T} - C_{1T} - C_{1T}/(0.7q_T^2 + 0.56q_T + 0.43)}{1 - C_{2R}} \tag{28}$$

in order to coincide the center frequency $f_R$ of the reflectors with the center frequency $f_T$ of the transducer. When the substrate 11 consists of an ST-cut quartz substrate and the electrodes are made of aluminum thin film, $$C_{2R} \simeq 4.33 \times 10^{-4} + 4.23 \times 10^{-2}(h_{mR}/L_R) + 7.9(h_{mR}/L_R)^2 + 10.8(h_{gR}/L_R)^2 + 18.5(h_{mR}/L_R)(h_{gR}/L_R) \tag{29}$$

$$C_{2T} \simeq 4.33 \times 10^{-4} + 4.23 \times 10^{-2}(h_{mT}/L_T) + 7.9(h_{mT}/L_T)^2 + 10.8(h_{gT}/L_T)^2 + 18.5(h_{mT}/L_T)(h_{gT}/L_T) \tag{30}$$

and $$C_{1T} \simeq 6.25 \times 10^{-4} + 0.12(h_{mT}/L_T) + 0.172(h_{gT}/L_T) \tag{31}$$

These values are obtained from our experiments.

Since the electrode period $L_R$ or $L_T$ is almost equal to the wavelength $\lambda$ of the surface acoustic waves, Eqs. (29), (30) and (31) may be rewritten into:

$$C_{2R} \simeq 4.33 \times 10^{-4} + 4.23 \times 10^{-2}(h_{mR}/\lambda) + 7.9(h_{mR}/\lambda)^2 + 10.8(h_{gR}/\lambda)^2 + 18.5(h_{mR}/\lambda)(h_{gR}/\lambda) \tag{32}$$

$$C_{2T} \simeq 4.33 \times 10^{-4} + 4.23 \times 10^{-2}(h_{mT}/\lambda) + 7.9(h_{mT}/\lambda)^2 + 10.8(h_{gT}/\lambda)^2 + 18.5(h_{mT}/\lambda)(h_{gT}/\lambda) \tag{33}$$

and $$C_{1T} \simeq 6.25 \times 10^{-4} + 0.12(h_{mT}/\lambda) + 0.172(h_{gT}/\lambda) \tag{34}$$

Substituting Eqs. (27), (32), (33) and (34) into Eq. (28) and further substituting the number N of transducer electrode pairs, the thickness $h_{mR}$ of aluminum electrodes in the reflectors, the depth $h_{gR}$ of the grooves, and the thickness $h_{gT}$ of aluminum electrodes and the depth $h_{gT}$ of grooves in the transducer, the required ratio $L_T/L_R$ can be obtained. Since $C_{2R}$, $C_{2T}$ and $C_{1T}$ are of the order of $10^{-3}$, the ratio $L_T/L_R$ is slightly smaller than unity.

In practice, however, it is extremely difficult to determine the ratio $L_T/L_R$ exactly according to Eq. (28) and it is not needed to do so. When $G_a/G_N \geq 1$ at the center frequency $f_R$ as shown in FIG. 4B, the characteristics of the resonators can be considerably improved as will be described in detail below.

Two roots $\eta_1$ and $\eta_2$ which make $G_a/G_N$ equal to unity are obtained from Eqs. (11), (18), (23) and (24) and are expressed as follows:

$$\eta_1 = 0 \tag{35}$$

and $$\eta_2 \simeq -1/(0.35q_T^2 + 0.3q_T + 0.2) \tag{36}$$

From Eqs. (20), (21), (35) and (36), the frequencies $f_1$ and $f_2$ at which $G_a/G_N = 1$ are obtained. That is, $$f_1 = (1 - C_{2T} - C_{1T})V_s/L_T \tag{37}$$

and $$f_2 = \{1 - C_{2T} - C_{1T} - C_{1T}/(0.35q_T^2 + 0.3q_T + 0.2)\}V_s/L_T \tag{38}$$

Therefore, the frequency range at which $G_a/G_N \geq 1$ is expressed by the following relation:

$$\{1 - C_{2T} - C_{1T} - C_{1T}/(0.35q_T^2 + 0.3q_T + 0.2)\}V_s/L_T \leq f \leq (1 - C_{2T} - C_{1T}) \times V_s/L_T \tag{39}$$

The ratio $L_T/L_R$ can be determined from the condition that the center frequency $f_R$ of the reflectors given by Eq. (5) is within the frequency range given by Eq. (39). That is, $$\frac{1 - C_{2T} - C_{1T} - C_{1T}/(0.35q_T^2 + 0.3q_T + 0.2)}{1 - C_{2R}} \leq \quad (40)$$

$$L_T/L_R \leq \frac{1 - C_{2T} - C_{1T}}{1 - C_{2R}}$$

It follows therefore that when the ratio $L_T/L_R$ is determined according to Eq. (40), the condition $G_a/G_N \geq 1$ is met at the reflector center frequency $f_R$. As a consequence, a SAW resonator with a low resonance resistance can be provided.

An optimum value obtained from Eq. (26) of course satisfies Eq. (40).

Next the design criteria for determining the distance or spacing between the transducer 14 and the reflectors 12 and 13 when the ratio $L_T/L_R$ is determined based on Eq. (40) will be described below. First the resonance condition of a cavity type SAW resonator will be described. The resonance condition is expressed by $$2\pi\left(N + \frac{l_1}{\lambda} + \frac{l_2}{\lambda}\right) - \phi_R - \phi_T = m\pi \quad (41)$$

where $l_1$ and $l_2$ are the distance between the center line of the innermost electrode of the reflector 12 or 13 and the center line of the outermost electrode of the transducer 14; that is, the distance or spacing between the transducer 14 and the reflectors 12 and 13 as shown in FIG. 5;

$\phi_R$ is the phase shift of the surface waves when reflected;

$\phi_T$ is the phase shift of the surface waves when propagated through the transducer; and m is a positive integer.

It is known that $\phi_R$ becomes $\pi/2$ at the center frequency $f_R$ of the reflector 12 or 13. The phase shift of the transducer 14 is obtained as follows. According to Reference [1], the transmission coefficient of the transducer 14 with a number of N electrode or finger pairs is expressed by $$T = (1 - p^2)/(e^2 - p^2/e^2) \quad (42)$$

where p and e are obtained from Eqs. (8) and (11), respectively. Therefore, the phase shift $\phi_T$ is expressed by $$\phi_T = \tan^{-1}\{Im(T)/Re(T)\} \quad (43)$$

where $Im(T)$ is the imaginary part of T and $Re(T)$ is the real part thereof.

The phase shift $\phi_T(f_T)$ of the transducer at the center frequency $f_T$ thereof is obtained from Eqs. (23), (24), (25), (42) and (43) and its approximation is given by the equation $$\phi_T(f_T) \simeq (0.3 + 0.55q_T)\pi \quad (44)$$

Substituting Eq. (41) into Eq. (44), the resonance condition at the frequency $f_R$ ($=f_T$) is obtained as follows.

$$l_1 + l_2 \simeq \{(5n+4)/10 + 0.28q_T\}\lambda \quad (45)$$

where n is a positive integer.

In addition, the spacings $l_i$ have to be so selected that the induced electric charge by the surface acoustic wave be efficiently derived by the transducer electrode fingers.

Therefore, the most desirable condition for $l_i$ is expressed by $$l_i = [(5n_i + 4)/20 + 0.14q_T]\lambda \quad (46)$$

where $n_i$ is a positive integer and i = 1 or 2. Both n and $n_2$ must be even or odd, but it is not needed to be the same number.

In practice, even when $l_1$ and $l_2$ are varied over a relatively large range from the value obtained from Eq. (46), practically satisfactory resonance characteristics may be obtained. Therefore, the values of $l_i$ may be so selected that the patterns for masks for forming electrodes may be created in the simplest manner.

Figure 6:
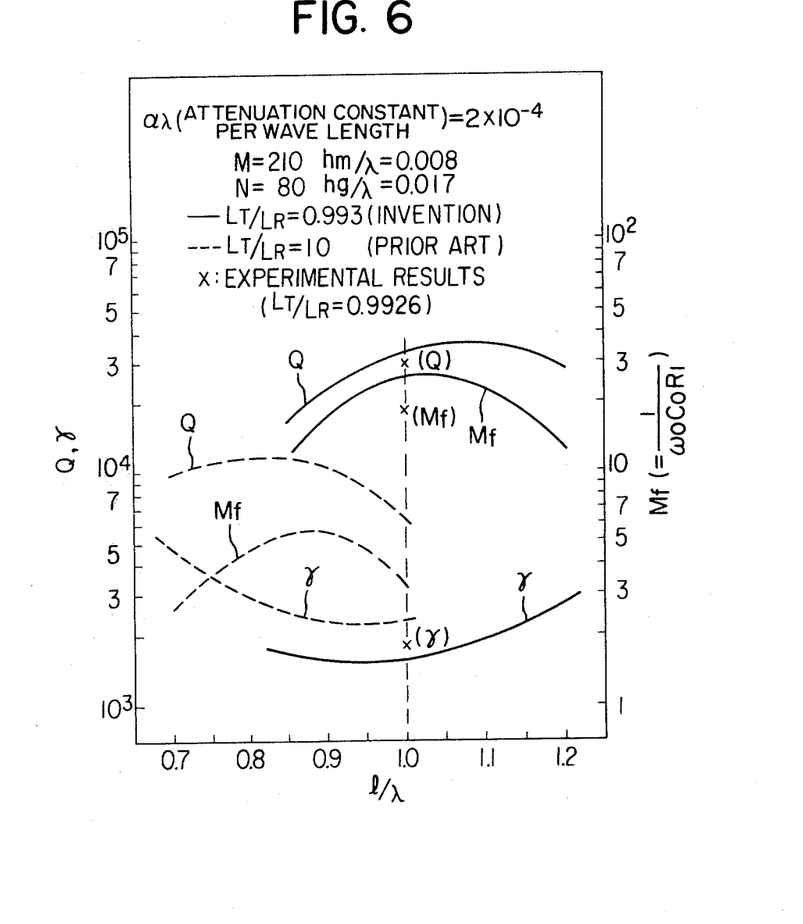
FIG. 6 shows the resonance characteristics of the SAW resonators of the present invention each having a quartz substrate and of the prior art as a function of the spacing between the transducer and reflector.

FIG. 6 shows the relationships between the spacing between the reflector and the transducer and the resonance characteristic when $l_1 = l_2$ and $n_i = n_2 = 3$. The solid curves show the characteristics of the SAW resonators in accordance with the present invention while the broken line curves show those of the prior art SAW resonators. The normalized value $l/\lambda$ (where $l = l_1 = l_2$) is plotted along the abscissa; Q and capacitance ratio $\gamma$, along the left ordinate; and the figure-of-merit $M_f$, along the right ordinate. $M_f$ and $\gamma$ are defined by $$M_f = 1/\omega_0 C_0 R_1$$

$$\gamma = C_0/C_1$$

where $\omega_0$ is the resonance angular frequency;

$C_0$ is the parallel capacitance;

$R_1$ is the resonance resistance; and $C_1$ is the equivalent series capacitance.

The design criteria are shown in TABLE 1.

TABLE 1

| Substrate | Electrode | M | N | $h_m/\lambda$ | $h_g/\lambda$ |
|---|---|---|---|---|---|
| ST-cut quartz | aluminum | 210 | 80 | 0.008 | 0.017 |

Remarks:
M: the number of electrodes in a reflector,
N: the number of electrode finger pairs in a transducer, and $h_m/\lambda$ and $h_g/\lambda$ are same both in the reflector and transducer.

From Eqs. (32), (33), (34) and (27), $$C_{2R} = C_{2T} = 6.91 \times 10^{-3}$$

$$C_{1T} = 4.51 \times 10^{-3}$$

$$q_T = 1.133$$

Substituting these values into Eq. (4), $$0.9908 \leq L_T/L_R \leq 0.9955 \quad (48)$$

An optimum value is obtained from Eq. (28); that is, $$L_T/L_R = 0.993 \quad (49)$$

The SAW resonator in accordance with the present invention whose characteristic curves are shown in solid lines in FIG. 6 satisfies Eq. (40). The equivalent constant values are calculated from the admittance characteristic, that is measured at the terminals 15 and 15' in FIG. 5. In this case, the surface acoustic wave propagation loss is considered in the calculation, where the attenuation constant $\alpha\lambda$ per one wavelength is assumed to be $$a_\lambda = 2 \times 10^{-4} \quad (50)$$

In FIG. 6, marks are experimental results for Q, $M_f$ and $\gamma$ of a 145-MHz SAW resonator to be described in detail below. From FIG. 6 it is apparent that the characteristics of the SAW resonators in accordance with the present invention are improved over the wide range of $1/\lambda$ as compared with the prior art SAW resonator.

Figure 7:
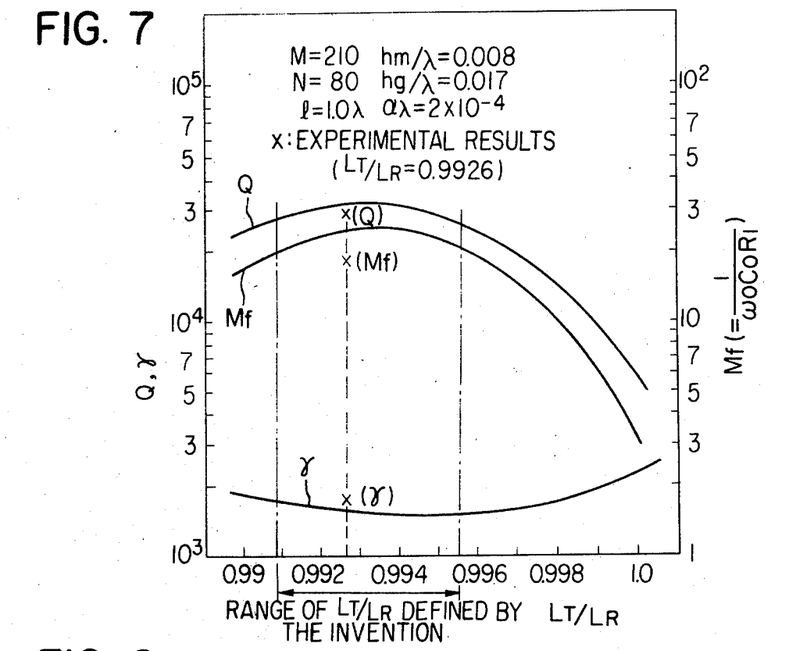
FIG. 7 shows the resonance characteristics of the SAW resonator of the present invention obtained theoretically and experimentally as a function of the ratio $L_T/L_R$, where $L_T$ is the electrode period of the transducer and $L_R$, that of the reflector.

In FIG. 7 are shown the relationships between the ratio $L_T/L_R$ and the characteristics of the SAW resonator in accordance with the present invention and the design criteria as shown in TABLE 1 when $1=l_1=l_2=1.0\lambda$. It is seen that when the ratio $L_T/L_R$ is within the range given by Eq. (40), excellent and uniform characteristics are obtained.

Next an example of the fabrication of a 145 MHz SAW resonator with the design criteria as shown in TABLE 1 will be described. Its electrode pattern is shown in TABLE 2.

TABLE 2

| M (ps) | $L_R$ (μm) | N (pairs) | $L_T$ (μm) | $L_T/L_R$ | W* (μm) | 1 (μm) |
|---|---|---|---|---|---|---|
| 210 | 21.60 | 80 | 21.44 | 0.9926 | 880 | 21.62 |

Remarks: W is the finger length of electrodes. The ratio $L_T/L_R = 0.9926$ satisfies Eq. (48). Aluminum electrodes are formed on the surface of an ST-cut quartz substrate by a deposition and photolithographic process, and the grooves are formed by etching the substrate by the $CF_4$ gas plasma etching process. The etching rate of aluminum is less than 1/20 as compared with that of quartz, the aluminum electrodes can be used as a mask for forming the grooves.

Figure 8:
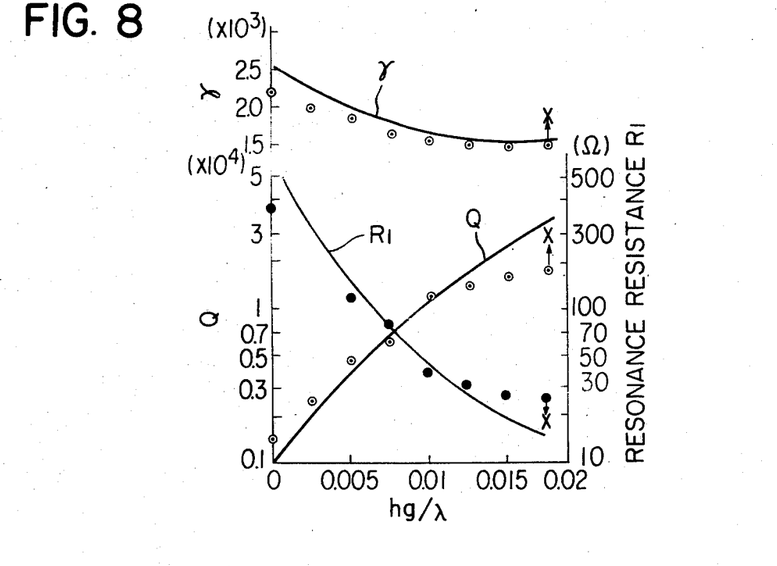
FIG. 8 shows the resonance characteristics of the quartz SAW resonator in accordance with the present invention as a function of the depth of the grooves.

In FIG. 8 the solid line curves show the dependence upon the depth of the grooves of the resonance characteristics obtained by calculation while the results obtained in the experiments in the atmosphere are indicated by ● and ◐. In the case of the design criteria as shown in TABLE 1, $h_g/\lambda = 0.017$ and in the vicinity of this value, resonance characteristics are almost saturated. After the groove forming, the resonators are sealed in vacuum. In FIG. 8, experimental results in vacuum are also plotted by marks X, that correspond to the experimental results shown in FIG. 6.

The comparison of the SAW resonator of the present invention with the prior art SAW resonator is shown in TABLE 3.

TABLE 3

| | M (ps) | N (pairs) | Q | $R_1$ in Ω | $\gamma$ | $M_f$ | resonance frequency in MHz |
|---|---|---|---|---|---|---|---|
| the invention (1) | 210 | 80 | 29,600 | 21.2 | 1,830 | 16.2 | 145 (approx.) |
| prior art (2) | 1,000 | 80 | 22,000 | 38.2 | 2,550 | 8.6 | 145 |
| prior art (3) | 300 | 80 | 17,400 | 55.4 | 2,580 | 6.7 | 130 |

Remarks:
(1) $h_m/\lambda = 0.008$ and $h_g/\lambda = 0.0175$
(2) aluminum electrodes only and $h_m/\lambda = 0.08$
(3) aluminum electrodes and grooves and $h_m/\lambda = 0.01$ and $h_g/\lambda = 0.016$.

From TABLE 3 it is apparent that even though the SAW resonator in accordance with the present invention has a number of reflector electrodes (M) less than the prior art resonators, the former has excellent characteristics.

In some cases, for the sake of fabrication of masks, it is preferable that the thickness $h_{mR}$ of the reflector electrodes be different from the thickness $h_{mT}$ of the transducer electrodes and also that the depth $h_{gR}$ of the reflector grooves is different from the depth $h_{gT}$ of the transducer grooves. For instance, in the case of a 200-MHz resonator with an ST-cut quartz substrate, the wavelength is approximately 15.8 μm. Therefore when the ratio of the electrode finger width to the spacing is unity, the finger width (=spacing) is $\lambda/4 = 3.95$ μm. Assume that an original mask of X20 be used and that the alignment allowance or tolerance be one micron. Then, the finger width on the actual electrode pattern can be adjusted by discrete values of 1/20 μm step, that is, in a step of 0.05 μm. Therefore when the finger width of reflector electrodes is 3.95 μm, the finger width of the transducer electrodes may be 3.90, 3.85 μm and so on. When the finger width of 3.90 μm is selected for the transducer electrodes, $L_T/L_R = 0.987$. If the design criteria as shown in TABLE 1 are used, the above-described ratio $L_T/L_R$ is not within the range given by Eq. (48); that is, the ratio does not satisfy an optimum condition determined in accordance with the present invention. However, an optimum condition can be met when the reflector and transducer are made different in thickness of electrodes and in depth of grooves as will be described in detail below.

Figure 9:
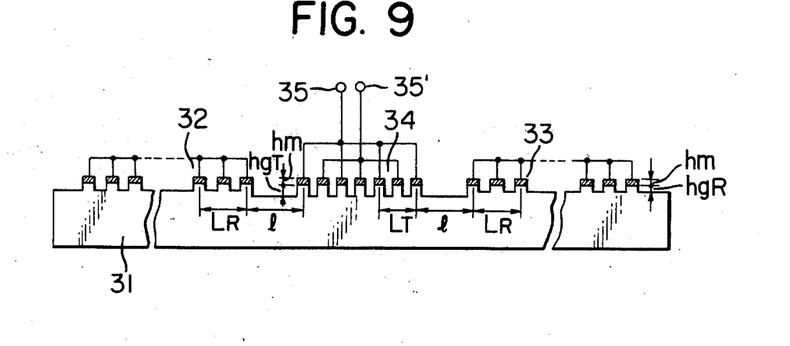
FIG. 9 is a cross sectional view of a second embodiment of the present invention in which the depth of the grooves in reflectors is different from that of the grooves in a transducer.

In another embodiment as shown in FIG. 9, the transducer electrodes are equal in thickness to the reflector electrodes, but the transducer groove depth is different from the reflector groove depth. For instance, the aluminum electrodes have the same thickness; that is, $h_{mR} = h_{mT} = (h_m) = 0.008\lambda$; and the depth $h_{gT}$ of the transducer grooves is $0.022\lambda$ while the depth $h_{gR}$ is $0.013\lambda$. Substituting these values into Eq. (40), we have $$0.985 \leq L_T/L_R \leq 0.990$$

Thus, the ratio $L_T/L_R = 0.987$ satisfies Eq. (40).

Figure 10:
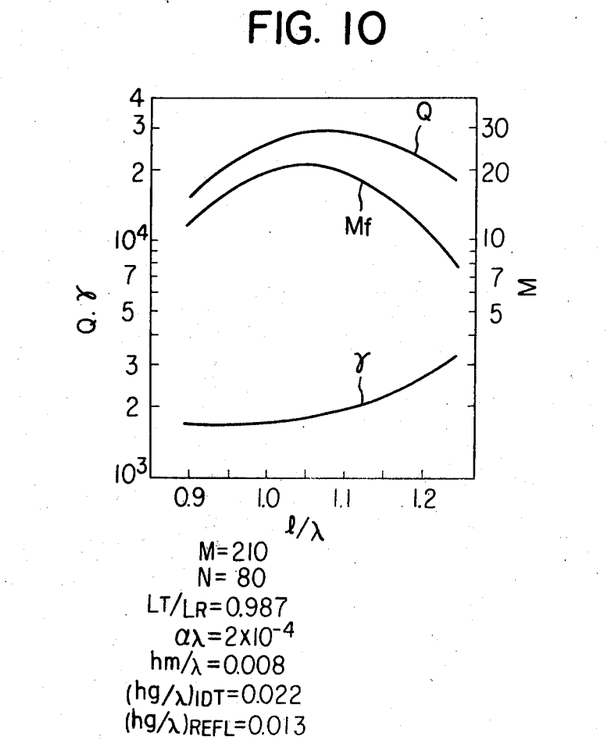
FIG. 10 shows the resonance characteristics of the second embodiment as a function of the spacing between the reflector and the transducer.

In FIG. 10 are shown the resonance characteristics of the embodiment shown in FIG. 9. It is seen that the embodiment shown in FIG. 9 exhibits the resonance characteristics almost similar to those shown in FIG. 6.

Figure 11:
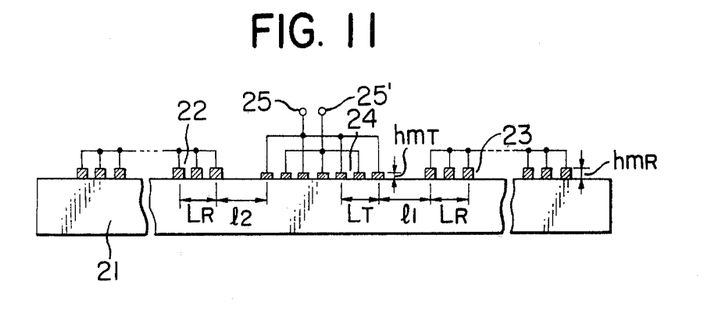
FIG. 11 is a cross sectional view of a third embodiment of the present invention in which the depth of the grooves is zero and the thickness of electrodes in reflectors is different from the thickness of electrodes in a transducer.

Next referring to FIG. 11, a further embodiment of the present invention will be described in which the electrode period is same both in the transducer and reflectors, but the transducer and reflector electrodes have different thickness; that is, $h_{mT} \neq h_{mR}$ and no groove is provided; that is, $h_g = 0$. It is assumed that $M = 210$; $N = 80$, $h_{mR} = 0.023\lambda$; $h_{mT} = 0.01\lambda$; and $h_g = 0$. Then, from Eq. (40), $$0.9976 \leq L_T/L_R \leq 1.002$$

Therefore, it is possible to make $L_T$ equal to $L_R$.

Figure 12:
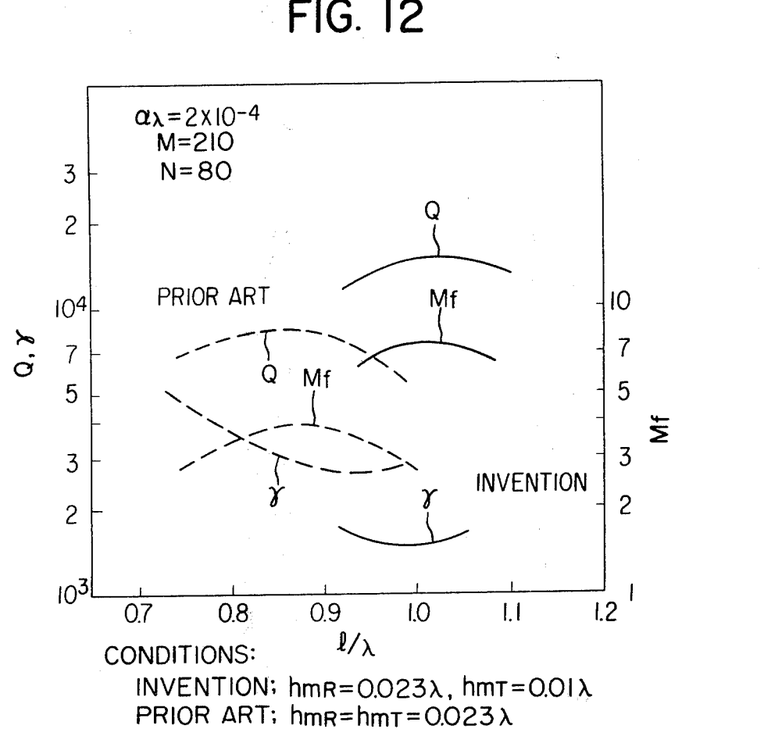
FIG. 12 shows the resonance characteristics of the third embodiment as a function of the spacing between the reflector and the transducer.

In FIG. 12 are shown the resonance characteristics of this embodiment. It is apparent that it has excellent characteristics as compared with the prior art SAW resonator.

Figure 13:
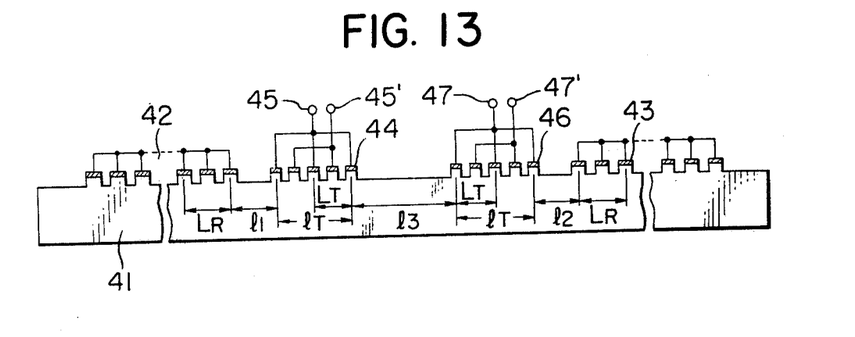
FIG. 13 is a cross sectional view of a fourth embodiment of the present invention in which two transducers are incorporated so as to provide a two-port SAW resonator.
Figure 14:
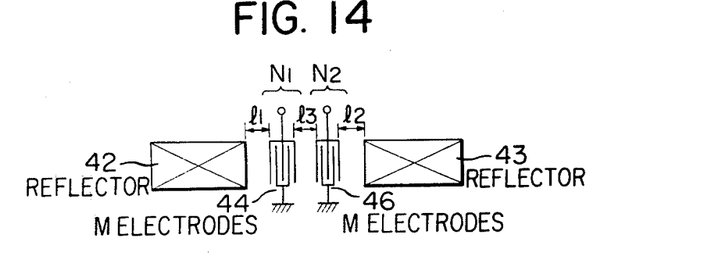
FIG. 14 is a top view of the fourth embodiment.

Referring next to FIGS. 13 and 14, a fourth embodiment of the present invention; that is, a two-port type SAW resonator will be described. As with one-port type SAW resonators described previously, the center frequency of the reflectors 42 and 43 are coincident with that of the transducers 44 and 46. That is, $L_T$ and $L_R$ are determined from Eq. (40). The spacing between the reflectors 42 and 43 and the transducers 44 and 46 is so determined as to satisfy the following relation (51).

$$\frac{10n+11}{20} L_T \leq l_1 + l_2 + l_3 \leq \left(\frac{10n+11}{20} + 0.6\right) L_T \quad (51)$$

where
 $l_1$ is the spacing between the transducer 44 and the reflector 42;
 $l_2$ is the spacing between the transducer 46 and the reflector 43, and
 $l_3$ is the spacing between the transducers 44 and 46.
Therefore, the sum of the spacings becomes $$(0.5n+0.55)L_T \leq 1 \leq (0.5n+1.15)L_T \quad (51')$$

Figure 15:
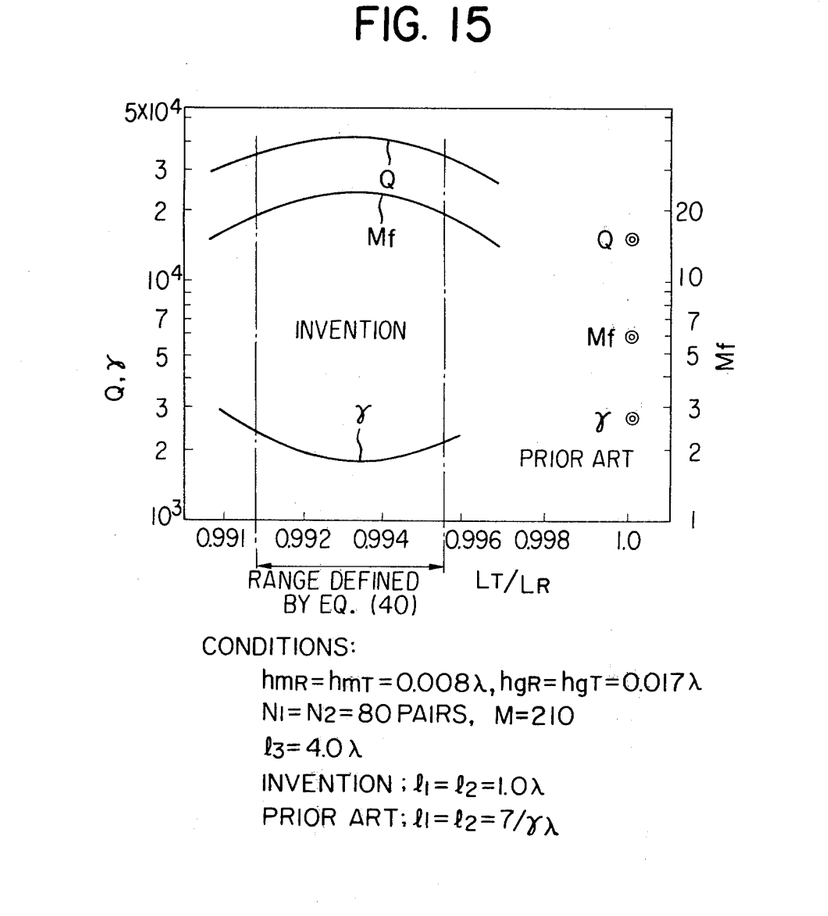
FIG. 15 shows the resonance characteristics of the fourth embodiment as a function to the ratio $L_T/L_R$.

In FIG. 15 are shown the resonance characteristics of the two-port SAW resonator shown in FIGS. 13 and 14 when $h_{mR} = h_{mT} = 0.008\lambda$, $h_{gR} = h_{gT} = 0.017\lambda$, $N_1 = N_2$ (the numbers of the electrode finger pairs in the transducers 44 and 46)=80, $l_1 = l_2 = 1.0\lambda$ and $l_3 = 4.0\lambda$. It is apparent that the resonance characteristics are by far excellent as compared with the prior art two-port SAW resonator in which $L_T/L_R = 1.0$, and $l_1 = l_2 = \frac{7}{8}\lambda$.

The SAW resonators in accordance with the present invention can be made very compact in size and light in weight. As a result, it can be mounted at two points so that the stresses due to mounting the substrate can be made negligible as will be described in detail with reference to FIG. 16. A resonator generally indicated by the reference numeral 56 consists of a piezoelectric substrate 51, reflectors 52 and 53 and a transducer 54 formed over one surface of the substrate 51. Terminals are disposed at the midpoints of the ends of the longer sides and lead-out pins 58 and 58' are extended out of a base 57 and connected to the terminals 55 and 55', respectively, with lead wires 59 and 59'. The lead wires 59 and 59' are joined to the terminals 55 and 55' with an electrically conductive paste or by a suitable welding technique. Thus, the resonator 56 is supported at two points (55, 55') by the lead wires 59 and 59'. The resonator 56 and the lead wires 59 and 59' are air-tightly sealed in an enclosure 60.

Figure 16:
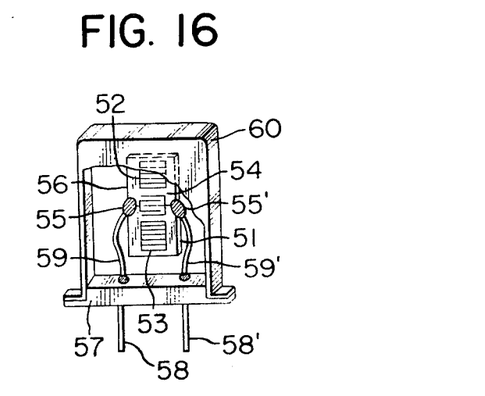
FIG. 16 is a view used for the explanation of a mounting structure for mounting a SAW resonator of the present invention encapsulated in an enclosure.

Since the resonators in accordance with the present invention can be made compact in size and light in weight as described previously, they can be mounted only at two points as shown in FIG. 16. As a result, they exhibit high resistance against vibrations and impacts. In addition, the frequency aging can be improved. Furthermore, the small-size enclosures which have been mass produced may be used as the enclosure 60; that is, a specially designed enclosure is not needed. As a consequence, the SAW resonators in accordance with the present invention can be fabricated at less costs.

Great advantages can be obtained when the SAW resonators in accordance with present invention are applied to small-sized oscillators and filters operating in the VHF and UHF bands.

What is claimed is:
1. A surface acoustic wave resonator of the type having a pair of surface acoustic wave reflectors which are spaced apart from each other by a suitable distance on a piezoelectric substrate and each of which comprises a grating electrode structure and a periodic array of grooves and a surface acoustic wave transducer which is interposed between the pair of surface acoustic wave reflectors and which comprises an interdigital electrode structure and a periodic array of grooves, characterized in that
 the electrode period $L_T$ of said surface acoustic wave transducer and the electrode period $L_R$ of said surface acoustic wave reflectors are so selected as to satisfy the following equation:

$$\frac{1 - C_{2T} - C_{1T} - C_{1T}/(0.35q_T^2 + 0.3q_T + 0.2)}{1 - C_{2R}} \leq$$

$$L_T/L_R \leq \frac{1 - C_{2T} - C_{1T}}{1 - C_{2R}}$$

where
 $C_{1T}$: the acoustic mismatching term at the boundary between the electroded portion and the non-electroded portion of the surface acoustic wave transducer and is given by $$C_{1T} = |1 - Z_2/Z_1|/\pi$$

where
 $Z_2$: the acoustic impedance of the electroded portion, and
 $Z_1$: the acoustic impedance of the non-electroded portion;
 $C_{2T}$: the relative frequency decrease due to the periodic structure of the surface acoustic wave transducer;
 $C_{2R}$: the relative frequency decrease due to the periodic structure of the surface acoustic wave reflector; and
 $q_T = \pi C_{1T} N$ where N: the number of electrode finger pairs in the surface acoustic wave transducer.

2. A surface acoustic wave resonator as set forth in claim 1 further characterized in that
 said piezoelectric substrate comprises an ST-cut quartz; the electrodes in said surface acoustic wave reflectors and transducer are made of aluminum; and
 $C_{2R}$, $C_{2T}$ and $C_{1T}$ are given by the following equations, respectively:

$$C_{2R} = 4.33 \times 10^{-4} + 4.23 \times 10^{-2}(h_{mR}/L_R) + 7.9(h_{mR}/L_R)^2 + 10.8(h_{gR}/L_R)^2 + 18.5(h_{mR}/L_R)(h_{gR}/L_R)$$

$$C_{2T} = 4.33 \times 10^{-4} + 4.23 \times 10^{-2}(h_{mT}/L_T) + 7.9(h_{mT}/L_T)^2 + 10.8(h_{gT}/L_T)^2 + 18.5(h_{mT}/L_T)(h_{gT}/L_T)$$

$$C_{1T} = 6.25 \times 10^{-4} + 0.12(h_{mT}/L_T) + 0.172(h_{gT}/L_T)$$

where
 $h_{mR}$: the thickness of the electrodes in the surface acoustic wave reflectors;
 $h_{gR}$: the depth of the grooves in the surface acoustic wave reflectors;
 $h_{mT}$: the thickness of the electrodes in the surface acoustic wave transducer; and
 $h_{gT}$: the depth of the grooves in the surface acoustic wave transducer.

3. A surface acoustic wave resonator as set forth in claim 2 further characterized in that
 both or either of the depth $h_{gR}$ of the surface acoustic wave reflector grooves and/or the depth $h_{gT}$ of the surface acoustic wave transducer grooves are/is zero.

4. A surface acoustic wave resonator as set forth in claim 1, 2 or 3 further characterized in that the spacing $l_1$ between said surface acoustic wave transducer and one of said two surface acoustic wave reflectors and the spacing $l_2$ between said surface acoustic wave transducer and the other surface acoustic wave reflector are determined by the following equation:

$$l_i = \left( \frac{5n_i + 4}{20} + 0.14 q_T \right) \lambda$$

where $n_i$: a positive integer; and $i = 1$ and 2.

5. A two-port surface acoustic wave resonator of the type having a pair of surface acoustic wave reflectors which are spaced apart from each other by a suitable distance on a piezoelectric substrate and each of which comprises a grating electrode structure and a periodic array of grooves and two surface acoustic wave transducers which are interposed between said two surface acoustic wave reflectors and each of which comprises an interdigital electrode structure and a periodic array of grooves, characterized in that the electrode periodic $L_T$ of the surface acoustic wave transducers and the electrode period $L_R$ of the surface acoustic wave reflectors are so selected as to satisfy the following equation:

$$\frac{1 - C_{2T} - C_{1T} - C_{1T}/(0.35 q_T^2 + 0.3 q_T + 0.2)}{1 - C_{2R}} \leqq$$

$$L_T/L_R \leqq \frac{1 - C_{2T} - C_{1T}}{1 - C_{2R}}$$

where $C_{1T}$: the acoustic mismatching term at the boundary between the electroded portion and the non-electroded portion of the surface acoustic wave transducer and is given by $$C_{1T} = |1 - Z_2/Z_1|/\pi$$

where $Z_2$: the acoustic impedance of the electroded portion, and $Z_1$: the acoustic impedance of the non-electroded portion;

$C_{2T}$: the relative frequency decrease due to the periodic structure of the surface acoustic wave transducer;

$C_{2R}$: the relative frequency decrease due to the periodic structure of the surface acoustic wave reflector; and $q_T = \pi C_{1T} N$ where N: the number of electrode finger pairs in each of the surface acoustic wave transducers.

6. A two-port surface acoustic wave resonator as set forth in claim 5 further characterized in that said piezoelectric substrate comprises an ST-cut quartz; the electrodes in said surface acoustic wave reflectors and transducers are made of aluminum; and $C_{2R}$, $C_{2T}$ and $C_{1T}$ are given by the following relations, respectively:

$C_{2R} = 4.33 \times 10^{-4} + 4.23 \times 10^{-2}(h_{mR}/L_R) + 7.9(h_{mR}/L_R)^2 + 10.8(h_{gR}/L_R)^2 + 18.5(h_{mR}/L_R)(h_{gR}/L_R)$ $C_{2T} = 4.33 \times 10^{-4} + 4.23 \times 10^{-2}(h_{mT}/L_T) + 7.9(h_{mT}/L_T)^2 + 10.8(h_{gT}/L_T)^2 + 18.5(h_{mT}/L_T)(h_{gT}/L_T)$ $C_{1T} = 6.25 \times 10^{-4} + 0.12(h_{mT}/L_T) + 0.172(h_{gT}/L_T)$ where $h_{mR}$: the thickness of the electrodes in the surface acoustic wave reflectors;

$h_{gR}$: the depth of the grooves in the surface acoustic wave reflectors;

$h_{mT}$: the thickness of the electrodes in the surface acoustic wave transducers; and $h_{gT}$: the depth of the grooves in the surface acoustic wave transducers.

7. A two-port surface acoustic wave resonator as set forth in claims 5 or 6 further characterized in that the spacing $l_1$ between one of the two surface acoustic wave reflectors and one of the two surface acoustic wave transducers, the spacing $l_2$ between the other surface acoustic wave reflector and the other surface acoustic wave transducer and the spacing $l_3$ between the two surface acoustic wave transducers are determined so as to satisfy the following relation:

$$\frac{10n + 11}{20} L_T \leqq l_1 + l_2 + l_3 \leqq \left( \frac{10n + 11}{20} + 0.6 \right) L_T$$

where n: a positive integer.

8. A surface acoustic wave resonator characterized in that the electrode period $L_T$ of a surface acoustic wave transducer and the electrode period $L_R$ of a surface acoustic wave reflector or surface acoustic wave reflectors are so selected as to satisfy the following equation:

$$\frac{1 - C_{2T} - C_{1T} - C_{1T}/(0.35 q_T^2 + 0.3 q_T + 0.2)}{1 - C_{2R}} \leqq$$

$$L_T/L_R \leqq \frac{1 - C_{2T} - C_{1T}}{1 - C_{2R}}$$

where $C_{1T}$: the acoustic mismatching term at the boundary between the electroded portion and the non-electroded portion of the surface acoustic wave transducer and is given by $$C_{1T} = |1 - Z_2/Z_1|/\pi$$

where $Z_2$: the acoustic impedance of the electroded portion, and $Z_1$: the acoustic impedance of the non-electroded portion;

$C_{2T}$: the relative frequency decrease due to the periodic structure of the surface acoustic wave transducer;

$C_{2R}$: the relative frequency decrease due to the periodic structure of the surface acoustic wave reflector; and $q_T = \pi C_{1T} N$ where N: the number of electrode finger pairs in the surface acoustic wave transducer;

a pair of terminals are attached substantially at the midpoints of the longer sides, respectively, of a piezoelectric substrate upon which said surface acoustic wave reflectors and transducer are formed and are electrically connected to said surface acoustic wave transducer;

lead wires extended from a base are electrically joined to said pair of terminals, respectively, whereby said piezoelectric substrate is supported at two points by said lead wires; and said piezeoelectric substrate and said pair of lead wires are encapsulated in a case which in turn is sealed air-tightly with said base.

* * * * *